(12) United States Patent
Lill et al.

(10) Patent No.: US 12,106,946 B2
(45) Date of Patent: Oct. 1, 2024

(54) TURBOMOLECULAR PUMP AND CATHODE ASSEMBLY FOR ETCHING REACTOR

(71) Applicant: Lam Research Corporation, Fremont, CA (US)

(72) Inventors: Thorsten Lill, Santa Clara, CA (US); Mariusch Gregor, Gilroy, CA (US)

(73) Assignee: Lam Research Corporation, Fremont, CA (US)

( * ) Notice: Subject to any disclaimer, the term of this patent is extended or adjusted under 35 U.S.C. 154(b) by 207 days.

(21) Appl. No.: 17/438,931

(22) PCT Filed: Mar. 13, 2020

(86) PCT No.: PCT/US2020/022792
§ 371 (c)(1),
(2) Date: Sep. 13, 2021

(87) PCT Pub. No.: WO2020/190783
PCT Pub. Date: Sep. 24, 2020

(65) Prior Publication Data
US 2022/0186734 A1   Jun. 16, 2022

Related U.S. Application Data

(60) Provisional application No. 62/819,223, filed on Mar. 15, 2019.

(51) Int. Cl.
*H01J 37/32*   (2006.01)
*F04D 19/04*   (2006.01)
(Continued)

(52) U.S. Cl.
CPC ...... *H01J 37/32834* (2013.01); *F04D 19/042* (2013.01); *H01J 37/3244* (2013.01);
(Continued)

(58) Field of Classification Search
CPC ........... H01J 37/32449; H01J 37/32513; H01J 37/32633; H01J 37/32091; H01J 37/321;
(Continued)

(56) References Cited

U.S. PATENT DOCUMENTS 6,514,348 B2 *  2/2003  Miyamoto .......... C23C 16/4412
                                               417/423.4
6,540,840 B1 *  4/2003  Toda ..................... C23C 16/409
                                                  392/397

(Continued)

FOREIGN PATENT DOCUMENTS

| CN | 101275574 | 10/2008 |
| CN | 113574649 | 10/2021 |

(Continued)

OTHER PUBLICATIONS

"International Application Serial No. PCT US2020 022792, International Preliminary Report on Patentability mailed Sep. 30, 2021", 11 pgs.

(Continued)

*Primary Examiner* — Kurt Sweely
(74) *Attorney, Agent, or Firm* — Schwegman Lundberg & Woessner, P.A.

(57) ABSTRACT

A processing chamber and method of etching a semiconductor substrate are presented. The processing chamber is symmetric, with the centerlines of a chuck and stem of a stage to retain a semi-conductor substrate aligned with a centerline of a passage in a core of a pump used to evacuate the processing chamber and with a center-line of a gas port through which gas is introduced to the processing chamber. The stem extends through the passage and a spiral groove is formed in the passage in only one of the stem or an inner surface of the core to provide pumping action to counter back streaming of the gas from an exhaust of the pump in an (Continued)

intermediate and viscous flow regime inside a gap between the stem and the core.

13 Claims, 7 Drawing Sheets

(51) Int. Cl.
  *H01L 21/683* (2006.01)
  *H01L 21/687* (2006.01)

(52) U.S. Cl.
  CPC .. *H01J 37/32513* (2013.01); *H01J 37/32715* (2013.01); *H01L 21/68785* (2013.01); *H01L 21/68792* (2013.01); *H01J 37/321* (2013.01); *H01J 37/32633* (2013.01); *H01L 21/6831* (2013.01)

(58) Field of Classification Search
  CPC ............ H01J 37/3211; H01J 37/32431; H01J 37/3244; H01J 37/32568; H01J 37/32577; H01J 37/32651; H01J 37/32715; H01J 37/32743; H01J 37/32788; H01J 37/32834; C23C 16/4409; C23C 16/45517; C23C 16/45591; C23C 16/4585; C23C 16/4412; C23C 16/45506; C23C 16/45508; C23C 16/45589; C23C 16/4584; C23C 16/4586; C23C 16/505; C23C 16/509; C23C 16/5093; H01L 21/68764; H01L 21/68785; H01L 21/67069; H01L 21/67742; H01L 21/67748; H01L 21/6831; H01L 21/68792; C30B 25/12; C30B 25/14; F04D 19/042; F04D 29/701
  See application file for complete search history.

(56) References Cited

U.S. PATENT DOCUMENTS

| | | | | |
|---|---|---|---|---|
| 6,547,844 | B2* | 4/2003 | Rikyuu | B01D 45/08 |
| | | | | 55/DIG. 15 |
| 6,689,221 | B2 | 2/2004 | Ryding et al. | |
| 7,547,860 | B2* | 6/2009 | Tanaka | H01L 21/67069 |
| | | | | 118/728 |
| 2005/0051520 | A1 | 3/2005 | Tanaka | |
| 2007/0116873 | A1* | 5/2007 | Li | C23C 16/45517 |
| | | | | 700/121 |
| 2008/0079220 | A1* | 4/2008 | Kovalerchik | F16J 15/121 |
| | | | | 277/345 |
| 2014/0051253 | A1* | 2/2014 | Guha | H01J 37/32633 |
| | | | | 156/345.33 |
| 2015/0047785 | A1* | 2/2015 | Kellogg | H01J 37/32816 |
| | | | | 156/345.1 |
| 2019/0172689 | A1* | 6/2019 | Nagaseki | H01L 21/6719 |

FOREIGN PATENT DOCUMENTS

| | | |
|---|---|---|
| JP | H0239427 A | 2/1990 |
| JP | H04247878 A | 9/1992 |
| JP | 2001351870 A | 12/2001 |
| JP | 2003071271 A | 3/2003 |
| JP | 2007177323 A | 7/2007 |
| JP | 2008248754 A | 10/2008 |
| JP | 2017059579 A | 3/2017 |
| JP | 2019523987 A | 8/2019 |
| JP | 2022525753 | 5/2022 |
| JP | 7511570 B2 | 6/2024 |
| KR | 2019870008554 | 6/1987 |
| KR | 20140056084 | 5/2014 |
| KR | 20140086955 | 7/2014 |

OTHER PUBLICATIONS

International Application Serial No. PCT/US2020/022792, International Search Report mailed Jul. 2, 2020, 3 pgs.
International Application Serial No. PCT/US2020/022792, Written Opinion mailed Jul. 2, 2020, 9 pgs.
Japanese Application Serial No. 2021-555429, Notification of Reasons for Refusal mailed Feb. 20, 2024, w/ English Translation, 10 pgs.
Taiwanese Application Serial No. 109108145, Office Action mailed Apr. 29, 2024, English translation, 4 pgs.
"Chinese Application Serial No. 202080021549.2, Office Action mailed May 17, 2024", w English translation, 16 pgs.
"Korean Application Serial No. 10-2021-7033234, Office Action mailed May 29, 2024", w English Translation, 15 pgs.
"Japanese Application Serial No. 2021-555429, Response filed Apr. 3, 24 to Notification of Reasons for Refusal mailed Feb. 20, 2024", W English translation, 27 pgs.
Japanese Application Serial No. 2024-101655, Voluntary Amendment filed Jul. 16, 2024, w/ English claims, 14 pgs.
Korean Application Serial No. 10-2021-7033234, Response filed Jul. 29, 2024 to Notice of Preliminary Rejection mailed May 29, 2024, w/ English translation, 28 pgs.
Taiwanese Application Serial No. 109108145, Response filed Jun. 21, 24 to Office Action mailed Apr. 23, 24, w/current English claims, 5 pgs.

* cited by examiner

TURBOMOLECULAR PUMP AND CATHODE ASSEMBLY FOR ETCHING REACTOR

PRIORITY

This application is a U.S. National Stage Filing under 35 U.S.C. 371 from International Application No. PCT/US2020/022792, filed on Mar. 13, 2020, and published as WO 2020/190783 A1 on Sep. 24, 2020, which claims the benefit of priority to U.S. Provisional Patent Application Ser. No. 62/819,223, filed Mar. 15, 2019, each of which is incorporated herein by reference in its entirety.

TECHNICAL FIELD

The subject matter disclosed herein generally relates to a semiconductor manufacturing apparatus, as well as methods, systems, and programs for using the semiconductor manufacturing apparatus. In some examples, the subject matter herein relates to a turbomolecular pump and etching management provided during operation of a turbomolecular pump.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

The incessantly decreasing features sizes and device geometry for semiconductor devices and integrated circuits continue to demand improved fabrication processes and machines. Currently, integrated circuit fabrication facilities are routinely producing devices having feature sizes of 65 nm (0.065 µm), which will be even further reduced in coining generations.

Current fabrication processes involve introducing plasma in a process chamber to either react or facilitate a reaction with a substrate disposed therein. The substrate being processed may be a semiconductor substrate, such as a (Silicon) Si substrate. Plasma processing is used for a wide variety of applications including etching of materials from substrates, deposition of materials onto substrates, cleaning of substrate surfaces, and modification of substrate surfaces. As the feature sizes of elements on the substrate decrease, the operation conditions in, as well as the geometry, of the processing chamber become more exacting.

SUMMARY

Example methods, systems, and apparatuses directed to providing a symmetric processing environment. Examples merely typify possible variations. For example, in one embodiment, a processing chamber system comprises a processing chamber and a pump. The processing chamber comprises a gas port to introduce gas into an upper region of the processing chamber and a stage disposed within the processing chamber under the gas port. The pump is arranged at a lower region of the processing chamber to remove the gas from the processing chamber. The pump includes a core having a passage disposed therein. The stage comprises a chuck configured to retain a substrate and a stem extending from the chuck, the stem configured to pass through an entirety of the passage in the core.

In one embodiment, the lower region of the processing chamber has an opening configured to align with the passage and accept the stem, and one or more spiral grooves are formed in the stem opposing an inner surface of the core, each spiral groove having dimensions to provide pumping action to counter back streaming of the gas from an exhaust of the pump to the processing chamber in an intermediate and viscous flow regime inside a gap between the stem and the core.

In one embodiment, the inner surface of the core is planar.

In one embodiment, the lower region of the processing chamber has an opening configured to configured to align with the passage and accept the stem, and one or more spiral grooves are formed in an inner surface of the core, each spiral groove having dimensions to provide pumping action to counter back streaming of the gas from an exhaust of the pump to the processing chamber in an intermediate and viscous flow regime inside a gap between the stem and the core.

In one embodiment, a surface of the stem opposing the inner surface of the core is planar.

In one embodiment, the stage is disposed symmetrically within the processing chamber with respect to the gas port, the core of the pump and the stem are aligned along a centerline under the gas port.

In one embodiment, the sidewall of the processing chamber has an opening through which the substrate is configured to pass during loading of the substrate on the chuck prior to etching and unloading of the substrate from the chuck after etching.

In one embodiment, the stage is movable between a lower position at which the substrate is able to be loaded onto and unloaded from the stage and an upper position at which the substrate is positioned to be processed.

In one embodiment, a pump screen is disposed in the processing chamber, the pump screen having an opening through which the stage is disposed when in the upper position. The pump screen may have one or more adjustable openings. In some embodiments, the pump screen may be formed by overlapping slats. In such embodiments, the opening adjusted by adjustment of overlap between at least one pair of the slats.

In one embodiment, a source radio frequency (RF) is disposed uniformly across the upper region of the processing chamber and a bias RF is coupled to the stage.

In one embodiment, a source radio frequency (RF) and a bias RF are each coupled to the stage to provide capacitive coupling.

In one embodiment, the lower region of the processing chamber has an opening configured to align with the passage and accept the stem, and a seal is disposed around the core of the pump and the stem of the stage, the seal configured to seal the passage in the core.

In one embodiment, a travel stop configured to control movement of the stage toward the pump. The travel stop may have a hole disposed therein sized to allow a lower region of the chuck to pass therethrough while stopping an upper region of the chuck. A chamber seal may be disposed in a groove on the travel stop or a lower region of the chuck to isolate the upper region of the processing chamber (above the travel stop) from the lower region of the processing chamber (below the travel stop) such that pressures in the upper and lower regions of the processing chamber are isolated from each other. A surface of the chamber seal facing the travel stop (if the chamber seal is in the lower region of the chuck) or a lower region of the chuck (if the chamber seal is in the travel stop) may be flat.

In one embodiment, a processing chamber comprises: a gas port to introduce gas into an upper region of the processing chamber; a stage disposed under the gas port, the stage comprising a chuck configured to retain a substrate and a stein extending from the chuck; and a travel stop configured to control movement of the stage toward the pump.

In one embodiment, the processing chamber further comprises a chamber seal disposed in a groove on one of the travel stop or a lower portion of the chuck, the chamber seal configured to isolate the upper region of the processing chamber, which is above the travel stop, from the lower region of the processing chamber, which is below the travel stop, such that pressures in the upper and lower regions of the processing chamber are independent.

In one embodiment, a pump is attached to the processing chamber to remove the gas from the processing chamber, the pump includes a core having a passage disposed therein, the stem passes through the passage in the core, and one or more spiral grooves are formed in the stein opposing an inner surface of the core and the inner surface of the core is planar or one or more spiral grooves are formed in the inner surface of the core and a surface of the stem opposing the inner surface of the core is planar, each spiral groove having dimensions to provide pumping action to counter back streaming of the gas from an exhaust of the pump to the processing chamber in an intermediate and viscous flow regime inside a gap between the stem and the core.

In one embodiment, a sidewall of the processing chamber has an opening through which the substrate is configured to pass during loading of the substrate on the chuck prior to etching and unloading of the substrate from the chuck after etching, the stage is movable between a first position at which the substrate is able to be loaded onto and unloaded from the stage and a second position at which the substrate is positioned to be processed, and a pump screen disposed in the processing chamber, the pump screen having an adjustable opening through which the stage is disposed when in the first position.

In one embodiment, an apparatus of a pump comprises: rotor stages each comprising rotor blades configured to rotate with rotation of the rotor stage; stator stages each comprising stator blades configured to remain stationary with rotation of the stator stage, the stator blades disposed at a different angle than an angle of the rotor blades, the stator stages interleaved with the rotor stages; and a cylindrical core from which the rotor stages and stator stages extend, a center of the cylindrical core having a passage disposed vertically therethrough, the passage having a diameter sized to accept a stem of a processing chamber stage on which a substrate is retained on a chuck, the stem extending from the chuck.

In one embodiment, the apparatus of the pump further comprises one or more spiral grooves formed in an inner surface of the cylindrical core, each spiral groove having dimensions to provide pumping action to counter back streaming of a gas from an exhaust of the pump in an intermediate and viscous flow regime inside a gap between the stem and the cylindrical core when the stem is disposed in the cylindrical core.

In one embodiment, the pump lacks a valve that covers an inlet of the pump and protects the pump from a higher pressure atmosphere.

In one embodiment, a method of operating a processing chamber system comprises loading a semiconductor substrate onto a chuck of a stage in a processing chamber, the stage having a stem extending from the chuck; moving the stage containing the semiconductor substrate into a processing position; rotating the stage when the stage is in the processing position; introducing an etching gas into an upper region of the processing chamber to etch the rotating semiconductor substrate; evacuating processed gas from the processing chamber using a pump having a passage in a center of a core of the pump, wherein the stem is configured to pass through the passage in the core to extend from an end of the pump opposite to the processing chamber; and limiting back streaming of the gas from an exhaust of the pump to the processing chamber in an intermediate and viscous flow regime inside a gap between the stem and the core by introducing a spiral groove in one of a surface of the stem or an inner surface of the core facing the stem, the spiral groove having dimensions to provide pumping action to counter the back streaming of the gas.

In some embodiments, a processing apparatus comprises a pump to evacuate gas from a chamber and a stage. The pump comprises rotor stages that include rotor blades configured to rotate with rotation of the stage; stator stages comprising stator blades configured to remain stationary with rotation of the stage, the stator blades disposed at a different angle from an angle of the rotor blades, the stator stages interleaved with the rotor stages; and a cylindrical core from which the rotor stages and stator stages extend, a center of the cylindrical core having a passage disposed vertically therethrough. The stage comprises a chuck configured to retain a substrate and a stem extending from the chuck through the passage. To provide pumping action to counter back streaming of the gas from an exhaust of the pump in an intermediate and viscous flow regime inside a gap between the stem and the core, a spiral groove is formed in the passage in only one of the stem or an inner surface of the core.

In some embodiments, a method of etching a substrate comprises: loading the substrate onto a chuck of a stage in a processing chamber; moving the stage containing the substrate from a loading position to an etching position by moving a stem of the stage through a core of a pump disposed at a bottom of the processing chamber; etching the substrate using plasma of gas introduced into an upper region of the processing chamber; after etching the substrate, moving the stage from the etching position to the loading position by moving the stein of the stage through the core of the pump; and unloading the substrate from the chuck after the stage has been moved from the etching position to the loading position.

In some embodiments, the method further comprises engaging the chuck with a pump screen disposed in the processing chamber, the pump screen having an opening through which the chuck is disposed when in the loading position.

In some embodiments, the method further comprises controlling movement of the stage through the core of the pump using a travel stop disposed in the processing chamber, the travel stop having a hole disposed therein sized to allow a lower region of the chuck to pass therethrough while stopping an upper region of the chuck; and isolating, using a chamber seal disposed in a groove on one of the travel stop or a lower region of the chuck, an upper region of the processing chamber above the travel stop from the lower region of the processing chamber below the travel stop, such that pressures in the upper and lower regions of the processing chamber are independent.

In some embodiments, an apparatus for etching a substrate comprises: means for loading the substrate onto a chuck of a stage in a processing chamber; means for moving the stage containing the substrate from a loading position to an etching position by moving a stem of the stage through a core of a pump disposed at a bottom of the processing chamber; means for etching the substrate using plasma of gas introduced into an upper region of the processing chamber; after etching the substrate, means for moving the stage from the etching position to the loading position by moving the stem of the stage through the core of the pump; and means for unloading the substrate from the chuck after the stage has been moved from the etching position to the loading position.

In some embodiments, the apparatus further comprises means for engaging the chuck with a pump screen disposed in the processing chamber, the pump screen having an opening through which the chuck is disposed when in the loading position.

In some embodiments, the apparatus further comprises means for controlling movement of the stage through the core of the pump using a travel stop disposed in the processing chamber, the travel stop having a hole disposed therein sized to allow a lower region of the chuck to pass therethrough while stopping an upper region of the chuck; and means for isolating, using a chamber seal disposed in a groove on one of the travel stop or a lower region of the chuck, an upper region of the processing chamber above the travel stop from the lower region of the processing chamber below the travel stop, such that pressures in the upper and lower regions of the processing chamber are independent. Other means for accomplishing other actions indicated herein may be present in addition to or instead of the means indicated above.

In some embodiments, a computer-readable storage medium (whether transitory or non-transitory) may store instructions for execution by one or more processors that configure the one or more processors, when the instructions are executed, to load a substrate onto a chuck of a stage in a processing chamber; move the stage containing the substrate from a loading position to an etching position by moving a stem of the stage through a core of a pump disposed at a bottom of the processing chamber; etch the substrate using plasma of gas introduced into an upper region of the processing chamber; after etching the substrate, move the stage from the etching position to the loading position by moving the stem of the stage through the core of the pump; and unload the substrate from the chuck after the stage has been moved from the etching position to the loading position.

In some embodiments, the instructions, when executed by the one or more processors, configure the one or more processors to engage the chuck with a pump screen disposed in the processing chamber, the pump screen having an opening through which the chuck is disposed when in the loading position.

In some embodiments, the instructions, when executed by the one or more processors, configure the one or more processors to control movement of the stage through the core of the pump using a travel stop disposed in the processing chamber, the travel stop having a hole disposed therein sized to allow a lower region of the chuck to pass therethrough while stopping an upper region of the chuck; and isolate, using a chamber seal disposed in a groove on one of the travel stop or a lower region of the chuck, an upper region of the processing chamber above the travel stop from the lower region of the processing chamber below the travel stop, such that pressures in the upper and lower regions of the processing chamber are independent. Other instructions for accomplishing other actions indicated herein may be present in addition to or instead of the instructions indicated above.

BRIEF DESCRIPTION OF THE DRAWINGS

Various ones of the appended drawings merely illustrate example embodiments of the present disclosure and cannot be considered as limiting its scope.

DETAILED DESCRIPTION

Figure 1A:
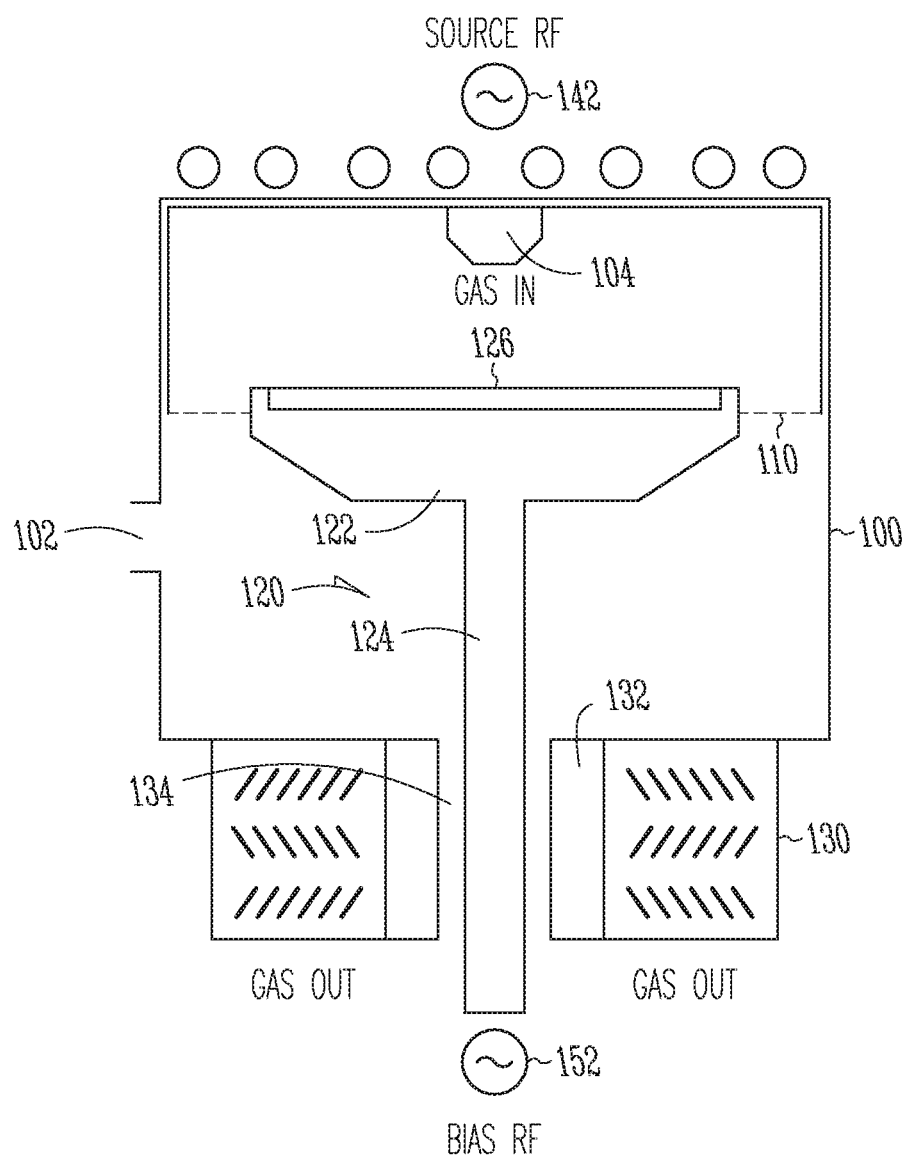
FIGS. 1A and 1B show a processing chamber, according to some example embodiments.

In some examples, deposition control and particle management within a processing chamber may be provided during operation of the processing chamber to which a turbomolecular pump is fated. Unless explicitly stated otherwise, components and functions are optional and may be combined or subdivided, and operations may vary in sequence or be combined or subdivided. In the following description, for purposes of explanation, numerous specific details are set forth to provide a thorough understanding of example embodiments. It will be evident to one skilled in the art, however, that the present subject matter may be practiced without these specific details.

Semiconductor fabrication includes multiple photolithographic, chemical and chemo-mechanical processing steps to create integrated circuits. In particular, the processes may include deposition, etching, and patterning. Various materials may be deposited or generated on a semiconductor (or insulating) substrate, including metallic and insulating (e.g., dielectric) layers, such as oxides, nitrides and photoresist. Deposition technologies include chemical vapor deposition (CVD), molecular beam epitaxy (MBE), physical vapor deposition (PVD), electrochemical deposition (ECD), and atomic layer deposition (ALD) among others. The materials deposited on the substrate, as well as the substrate materials may be patterned using photolithography. Etching may include removing of some or all of the exposed layers on the substrate. Etching may be performed using wet chemical etching or dry plasma etching. Chemical-mechanical planarization (CMP) may be used to planarize the substrate layers between depositions.

Successive generations of integrated circuitry have resulted in a continuous reduction in feature sizes, extending the capabilities of the above processes as well as the existing processing equipment and causing new processing equipment and techniques to be developed. The reduction in feature sizes has also increased the aspect ratio of features to be fabricated on the substrate. Aspect ratios, i.e., the ratio between the depth and the width of the features, for etching of deeply-recessed features currently stand at about 50:1 to 100:1 (or greater). These aspect ratios may be used for fabrication of a variety of circuit elements such as contact trenches and vias. However, such ratios are unable to be created using anisotropic wet etching and sidewall passivation of the dielectric layers disposed between the metallic layers. Instead, dry (plasma) etching may be used to provide strict control of etch profiles to create these structures.

Plasma etching may operate at pressures between about 0.1 and 5 Torr. The plasma may be formed from, for example, a chlorine or fluorine gas or oxygen-rich gas. The different gases may be used to etch different materials. For example, $Cl_2$ or $CF_4$ may be used to etch Si, $SiCl_4$ or $CCl_4$ may be used to etch Al, $CF_4$ may be used to etch other metals, such as Mo or W, and $CF_4$ or $SF_6$ may be used to etch $SiO_2$ or SiN. Ashing using oxygen may be used to remove photoresist. To obtain these plasmas, the gas molecules may be excited by an external bias that may deliver, e.g., 10-30 kW at frequencies from 5-10 Hz up to microwave frequencies (MHz-GHz).

Etching of the structure on a substrate may be complicated due to a number of factors, which include etching multi-layer features (e.g., semiconductor, insulator, metal). The different layers may have different etch rates. Consequently, etching of some of these layers may produce byproducts that deleteriously affect continued etching of the same layer or of a different layer. Controlling the etch rate may be further complicated by features that have high aspect ratios and structures that have different feature densities. Moreover, operating conditions in the processing chamber such as temperature, bias and/or pressure, as well as the chamber layout itself, may affect the etch rate. In the last case, any non-symmetry of the chamber may result in perturbation of the gas flow, and thus etching of the plasma, leading to inhomogeneities in the etching across the substrate. The inhomogeneities may, as above, be exacerbated by high aspect ratios and different feature densities due to the exposure to different amounts of plasma flow at different points along the substrate for extended periods.

Figure 1B:
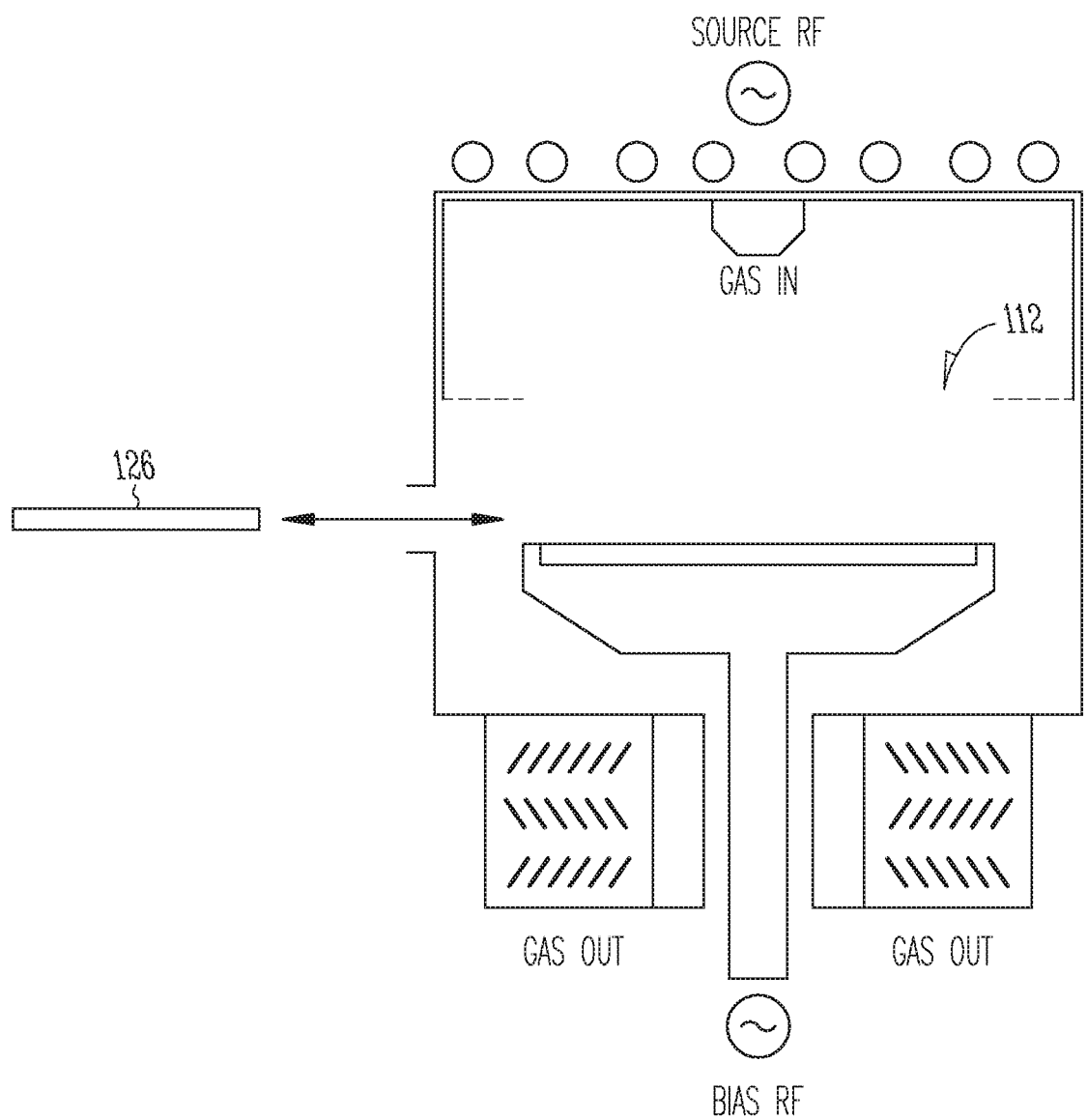

To alleviate some of the above issues, a symmetrical processing chamber design is provided. The changes to the processing chamber may also result in changes to the pump that services the processing chamber. FIGS. 1A and 1B show a processing chamber, according to some example embodiments. The processing chamber 100 may include a loading port 102 through which a substrate 126 is loaded into and unloaded from the processing chamber 100. The loading port 102 may be sealed during processing of the substrate 126. The processing chamber 100 may also include gas port 104 through which the plasma is introduced to the processing chamber 100. A pump screen 110 may be disposed within the processing chamber 100.

In addition, a movable stage 120 may be configured to retain thereon a substrate 126 that has been loaded into the processing chamber 100 via the loading port 102. The movable stage 120 may include a chuck 122 on which the substrate 126 is retained and a stem 124 that supports the chuck 122. The movable stage 120 may retain the substrate 126, e.g., via vacuum ports on the chuck 122. The substrate 126 may alternatively or in addition be retained in a recess in the chuck 122 or by clips or other retainers (not shown). The movable stage 120 may be centered within the processing chamber 100 such that the edges of the chuck 122 are equidistant from the sidewalls of the processing chamber 100. Similarly, the stem 124 may extend downwardly straight from the chuck 122 through a bottom portion of the processing chamber 100 along a central vertical axis thereof so that the stem 124 is also centered within the processing chamber 100.

The gas port 104 may be disposed at a top of the processing chamber 100, Similar to the movable stage 120, the gas port 104 may be centered within the processing chamber 100 such that the gas port 104 is equidistant from the sidewalls of the processing chamber 100. The gas port 104 may be centered over the movable stage 120 such that the centerline of the gas port 104 and the centerline of the movable stage 120 (both the chuck 122 and the entirety of the stem 124) are aligned.

The electromagnetic field is used to enable etching of the substrate 126 by the plasma formed by the gas introduced from the gas port 104. The electromagnetic field may be created by a source RF 142 (anode) and a bias RF 152 (cathode). The bias RF 152 is supplied via a cathode assembly on the stein 124. The source RF 142 and bias RF 152 may operate at the above voltage and frequency parameters (frequencies from several Hz to microwave frequencies and voltages differentials of about tens to a hundred or so volts). As shown in FIGS. 1A and 1B, the source RF 142 may be disposed and extend symmetrically along an outer edge of the top of the processing chamber 100 while the bias RF 152 is applied to the movable stage 120. Bath the source RF 142 and bias RF 152 may be disposed to provide a homogeneous potential difference between the source RF 142 and bias RF 152.

A pump 130 for extracting gases from the processing chamber 100 may be attached at the bottom portion of the processing chamber 100. The pump screen 110 may prevent debris and other etching byproducts from falling into an inlet of the pump 130. The movable stage 120 may be repositioned between an upper position (shown in FIG. 1A) in which the substrate 126 is etched and a lower position (shown in FIG. 1B) in which the substrate 126 is loaded onto or unloaded from the chuck 122. In some embodiments, the pump screen 110 may have an opening 112 sized to fit the chuck 122. In some embodiments, the opening 112 in the pump screen 110 may be adjustable such that, for example, the opening 112 is adjusted (reduced or increased) in size dependent on the position of the movable stage 120. In general, the pump screen 110 may have one or more adjustable openings 112, which may be formed by overlapping slats. The opening(s) 112 may be adjusted by adjustment of overlap between at least one pair of the slats. The overlapping slats may be similar to the slats used. in a camera iris and may be arranged in various embodiments as: a spiral shape (similar to that used in the above-mentioned camera iris), rings, along a single direction, or in a crosshatched pattern, among others. The overlapping slats may have a cross-section that is substantially constant or may have a cross-section that varies across at least a portion of the portion of the slat that overlaps with another slat such that an overall thickness of the overlapped slats remains substantially constant.

The movable stage 120 may also rotate at rotational speeds in the range of several hundred to thousand rpm (e.g., 400-1000 rpm), which may be dependent on the operation (e.g., etching, deposition, drying). In other embodiments, the movable stage 120 may be limited to vertical movement only during etching—that is the movable stage 120 may not rotate.

The pump 130 may be a turbomolecular pump that contains a rotatable circular core with a number of angled blades, multiple stages of stationary stator blades interleaved with high-speed turbine blades disposed at different angles. The turbomolecular pump may receive the reacted process gases (plasma) via an inlet at low pressures and further compress the gases before the gases are provided to a scrubber system at atmospheric pressure. As the circular core rotates, the blades impact the incoming gas molecules and transfer the mechanical energy of the blades into gas molecule momentum that is directed from the inlet through a fixed stator with gas transfer holes. The stages are arranged along a drive shaft that rotates at speeds of up to about 90,000 rpm. The gas is then compressed from stage to stage through the turbomolecular pump to an exhaust port, where it is drawn off by a backing pump that is tasked with maintaining an exhaust pressure below about 100 millitorr. The pumping speed may be about 50-3000 liters/s and the ultimate pressure may be $10^{-5}$-$10^{-8}$ Torr.

Alternatively, the pump 130 may be a molecular drag pump, in which the momentum transfer from mechanical to gas is effected by imparting the motion of a rapidly rotating solid surface to the gas molecules between a fixed surface and a rotating surface. The molecular drag pump may be a Holweck pump, in which the surfaces are in the form of a rotating spiraled drum, or a Gaede pump, in which the surfaces are in the form of slotted rotor discs. The molecular drag pump may have a higher backing pressure of between about 3-25 torr, lower vacuum in the chamber and lower pumping speed (up to ⅓ less) than the turbomolecular pump.

Alternatively, the pump 130 may be a turbo/drag pump, which combines the features of turbomolecular and molecular drag pumps. In this case, the rotor/stator arrays of the turbomolecular pump may be located inside the inlet while the molecular drag pump may be located closer to the exhaust port.

Independent of the type of pump, the pump 130, as above, may be centered at the bottom portion of the processing chamber 100 such that the centerline of the pump 130 is aligned with the centerline of the gas port 104 and the movable stage 120.

Rather than having a rotor with a solid core, the pump 130 shown in FIGS. 1A and 1B may contain a rotor core 132 with a through passage (also called center hole) 134 at the center of the rotor core 132. The through passage 134 may extend entirely through the pump 130, from the inlet side of the pump 130 adjacent to the processing chamber 100 to the exhaust side of the pump 130. The diameter of the through passage 134 may be slightly larger than the diameter of the stem 124 to permit the through passage 134 to accept the stem 124, allowing the stem 124 to extend vertically below the pump 130.

The through passage 134 allows the bias RF 152 to be routed through the pump 130. This arrangement avoids the use of a duct in the sidewall of the processing chamber 100 for the cathode to pass therethrough, which is one of the main geometric non-uniformities in the processing chamber 100. The arrangement of the source RF 142 and bias RF 152 thus permits a symmetrical bias to be created for the plasma to react with the substrate 122 and produce reacted process gases. The arrangement also permits symmetric flow within the processing chamber 100, increasing the azimuthal etching uniformity.

Figure 2:
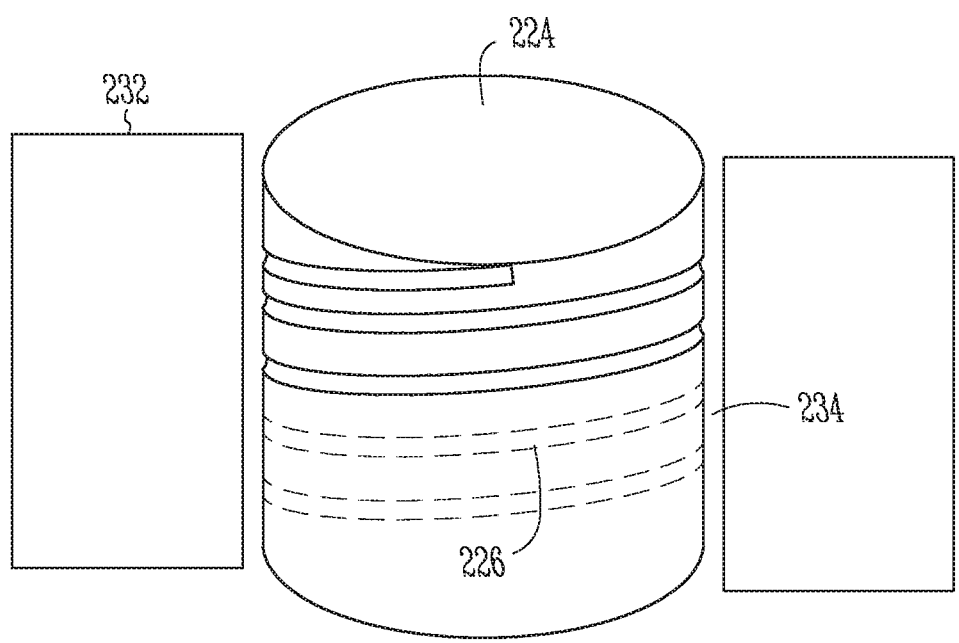
FIG. 2 shows a portion of a turbomolecular pump, according to some example embodiments.

The introduction of the through passage 134 in the core 132, however, may create a path between the inlet and exhaust of the pump 130, allowing gas to back stream from the high pressure exhaust to the low pressure inlet in the processing chamber 100. To avoid back streaming of the gas, a molecular drag pump may be designed in the through passage 134. Accordingly, FIG. 2 shows a portion of a pump, according to some example embodiments. In particular, FIG. 2 shows a perspective view of an enlarged portion of the rotor core and stem shown in FIGS. 1A/1B. As shown, the stem 224 of the movable stage is disposed in the through passage 234 formed in the rotor core 232. Similar to the arrangement of FIGS. 1A/1B, a small gap may be present between the stem 224 and the rotor core 232. The gap between the rotor core 232 and stein 224 may be minimized to reduce the amount of back gas flow.

As shown in FIG. 2, a portion of the stein 224 has a spiral groove 226 formed therein. During operation, the stem 224 and the rotor core 232 may rotate in opposite directions, causing displacement of the gas therebetween. The spiral groove 226 may oppose the rotor core 232 and, in some embodiments, may terminate before an end of the rotor core 232 (i.e., may not extend into the processing chamber 100 or outside of the rotor core 232) to avoid creating turbulence at the locations where the spiral groove 226 ends. In other embodiments, the spiral groove 226 may terminate slightly (e.g., a few mm) from an end of the rotor core 232, either inside the processing chamber or external to the rotor core 232 outside the processing chamber 100. The addition of the spiral groove 226 on the stem 224 may permit the gas between the stem 224 and the rotor core 232 to be guided by pumping action. Similar to a Holweck pump, in which the surfaces are in the form of a rotating spiraled drum, the momentum of the stein 224 and/or the rotor core 232 may be transferred to the gas by channeling the gas via the spiral groove 226. The rotation of the stem 224 may be in the direction of the spiral groove 226 (while that of the rotor core 232 may be in the opposite direction) to allow the gas to be routed (and momentum transferred to the gas) in the desired direction. The depth of the spiral groove 226 and pitch (distance between vertically aligned portions of the spiral groove 226) may be determined based on an empirical determination of these parameters to maintain the desired vacuum in the processing chamber 100 during operation. The use of a drag pump in this manner may allow the pumping action to counter back streaming of the gas from the exhaust to the processing chamber 100 in the intermediate and viscous flow regime inside the gap. In these flow regimes, molecules primarily affect the motion of other molecules via collisions. This is unlike the molecular flow regime, in which there are almost no collision between molecules in free space and most molecular interaction occurs between the molecules and the walls.

Although the spiral groove 226 is shown in FIG. 2 as being formed in the stem 224, in other embodiments, the spiral groove 226 may instead be formed in the rotor core 232. In this case, the groove depth and/or pitch may be different than that for a groove formed in the stein 224 to maintain the vacuum due to the difference in the circumference of the surface on which the groove is present. However, the groove may only be formed in either the stem 224 or the rotor core 232, but not both. This may avoid issues with turbulence caused by different drag forces within the gap. The surface opposing the surface with the spiral groove 226 may thus be planar (i.e., without intended grooves or protrusions); either the inner surface of the rotor core 232 opposing the stem 224 or the surface of the stem 224 opposing the inner surface of the rotor core 232 may be planar. While the groove depth and pitch may change the amount of drag force, in some embodiments, multiple spiral grooves 226 in the same direction and with the same pitch may be used to the same effect. In such embodiments, the grooves 226 may overlap along a circle at the same height on the stein 224 or the rotor core 232 (e.g., on opposite sides of the stein 224 at the same distance from a bottom of the stem 224).

In alternate embodiments, a seal may be used to avoid back streaming of the gas. The stem 224 may extend through a seal that is disposed on an inner side of the bottom portion of the processing chamber 100. The seal may be a flange or gasket that seals the processing chamber 100, allowing the movable stage 120 to move vertically within the processing chamber 100 while stopping the plasma from exiting via the through passage 134—thereby being vented through the stator and turbine blades. The seal may be formed from one or more metals and/or insulators (e.g., vacuum seal rubber). The seal may be a single or multilayer structure that contains the same or different materials.

Figure 3:
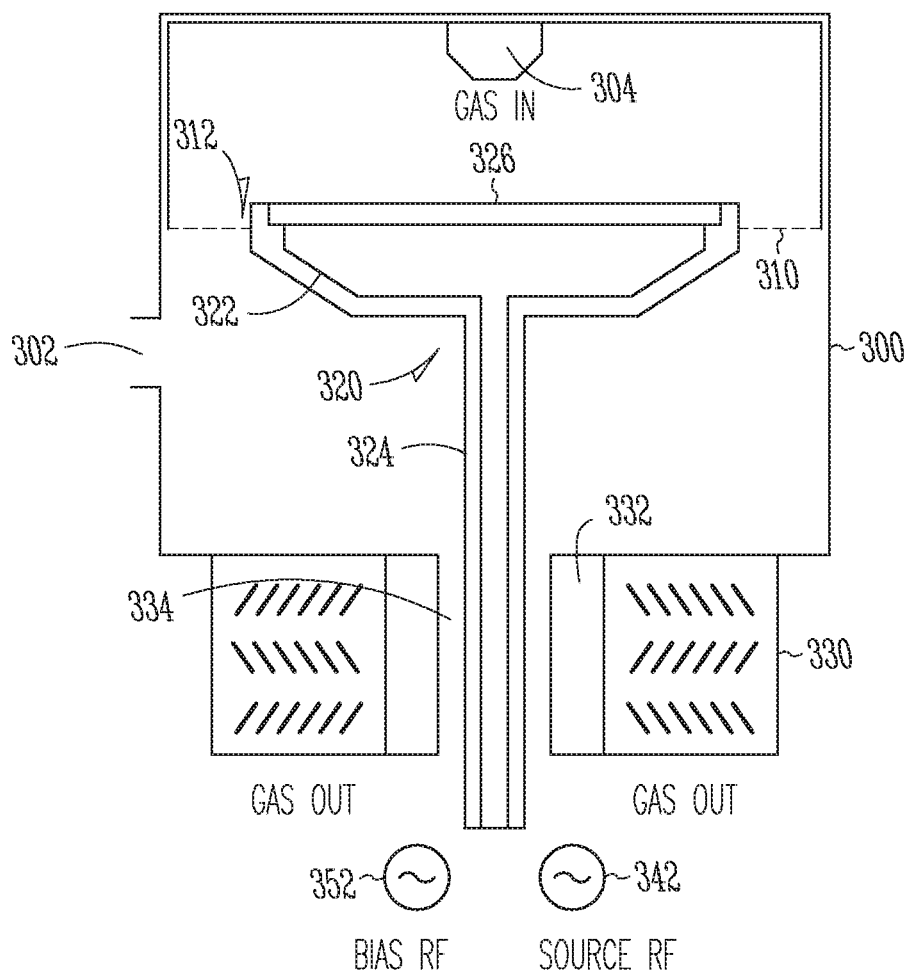
FIG. 3 shows a processing chamber, according to some example embodiments.

FIG. 3 shows a processing chamber 300, according to some example embodiments. The processing chamber 300 of FIG. 3 is similar to that shown in FIGS. 1A and 1B. The processing chamber 300 may include a loading port 302 through which a substrate 326 is loaded into and unloaded from the processing chamber 300. The loading port 302 may be sealed during processing of the substrate 326. The processing chamber 300 may also include gas port 304 through which gas is introduced to the processing chamber 300 to generate plasma. A pump screen 310 may be disposed within the processing chamber 300.

In addition, a movable stage 320 may be configured to retain thereon a substrate 326 that has been loaded into the processing chamber 300 via the loading port 302. The movable stage 320 may include a chuck 322 on which the substrate 326 is retained and a stem 324 that supports the chuck 322. The movable stage 320 may retain the substrate 326, e.g., via vacuum ports on the chuck 322. The movable stage 320 may be centered within the processing chamber 300 such that the edges of the chuck 322 are equidistant from the sidewalls of the processing chamber 300. Similarly, the stem 324 may extend vertically straight from the chuck 322 to a bottom portion of the processing chamber 300 so that the stem 324 is also centered within the processing chamber 300.

The gas port 304 may be disposed at a top portion of the processing chamber 300. Similar to the movable stage 320, the gas port 304 may be centered within the processing chamber 300 such that the gas port 304 is equidistant from the sidewalls of the processing chamber 300. The gas port 304 may be centered over the movable stage 320 such that the centerline of the gas port 304 and the centerline of the movable stage 320 (both the chuck 322 and the entirety of the stem 324) may be aligned.

The electromagnetic field is used to enable etching of the substrate 326 by the plasma generated from gas introduced from the gas port 304. The electromagnetic field may be created by a source RF 342 (anode) and a bias RF 352 (cathode). The bias RF 352 is supplied via a cathode assembly on the stem 324. The source RE and bias RE 352 may operate at the above voltage and frequency parameters. As shown in FIG. 3, unlike FIGS. 1A and 1B, the source RF 342 and the bias RE 352 are capacitively coupled and applied via the movable stage 320. Both the source RF 342 and bias RF 352 may be disposed to provide a homogeneous potential difference between the source RF 342 and bias RE 352, thereby creating a symmetrical bias for the plasma to react with the substrate 322 and produce reacted process gases.

A pump 330 for extracting gases from the processing chamber 300 may be attached at the bottom portion of the processing chamber 300. The pump screen 310 may prevent debris and other etching byproducts from falling into an inlet of the pump 330. The movable stage 320 may be moved between an upper position in which the substrate 326 is etched and a lower position in which the substrate 326 is loaded onto or unloaded from the chuck 322. As described above, in some embodiments, the pump screen 310 may have an opening 312 sized to fit the chuck 322. The pump 330 may be a turbomolecular pump, a molecular drag pump, or a turbo/drag pump.

The pump 330 may be centered at the bottom portion of the processing chamber 300 such that the centerline of the pump 330 is aligned with the centerline of the gas port 304 and the movable stage 320.

The pump 330 shown in FIG. 3 may contain a core 332 with a through passage 334 at the center. The through passage 334 may extend entirely through the pump 330, from the inlet side of the pump 330 adjacent to the processing chamber 300 to the exhaust side of the pump 330. The diameter of the through passage 334 may be slightly larger than the diameter of the stein 324 to permit the through passage 334 to accept the stein 324, allowing the stem 324 to extend vertically below the pump 330.

Although not shown, a spiral groove may be formed in the stem 324 or core 332, as described above, to prevent back flow of the gases. A seal and/or groove may also or instead be used. Note that as shown, the external portion of the movable stage 320 may be connected to the bias RF 352 while the internal portion of the movable stage 320 (shown as the center of the movable stage 320) may be connected to the source RF 342.

Figure 4:
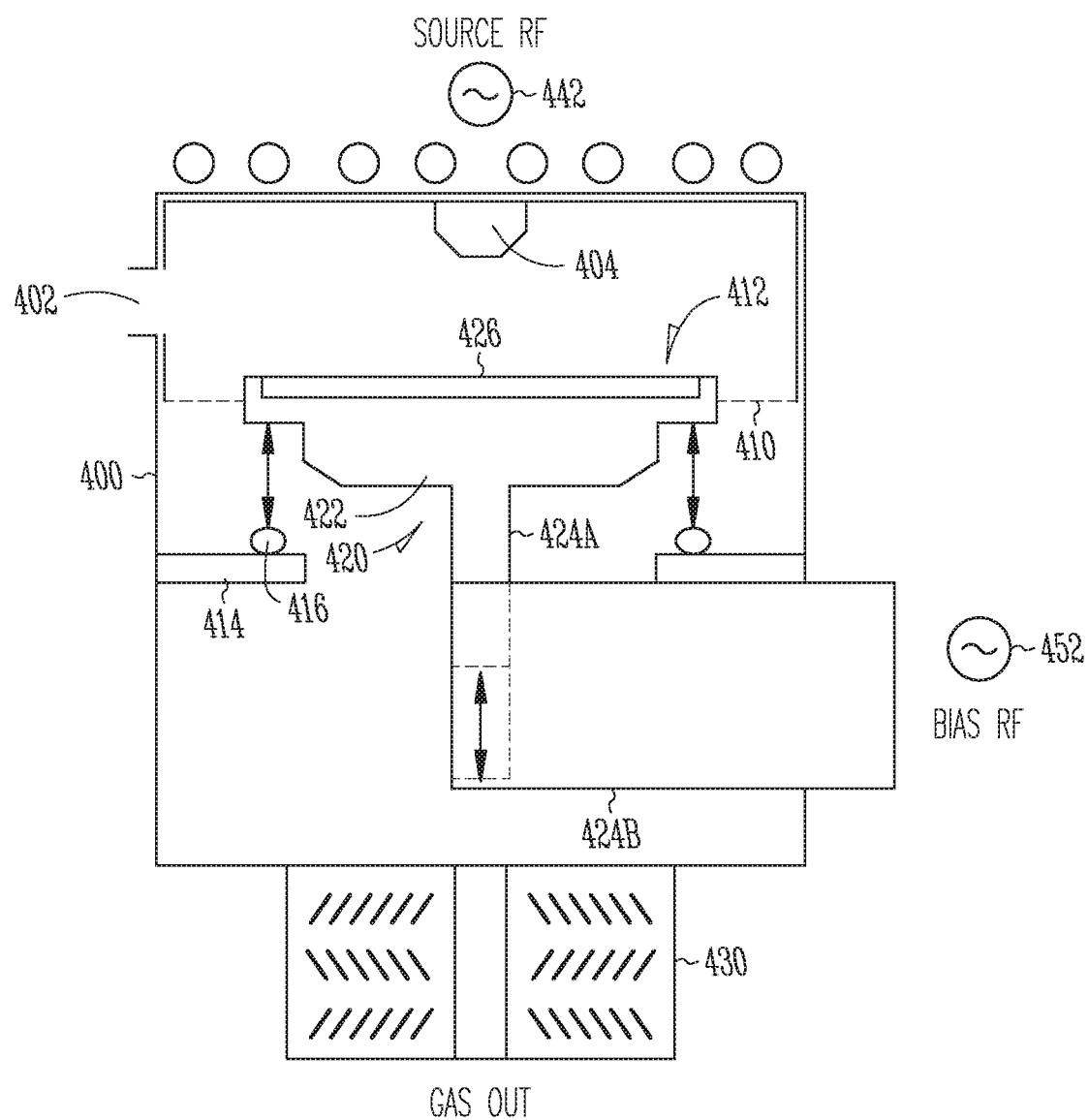
FIG. 4 shows a processing chamber, according to some example embodiments.

FIG. 4 shows a processing chamber, according to some example embodiments. Similar to the above, the processing chamber 400 may include a loading port 402 through which a substrate 426 is loaded into and unloaded from the processing chamber 400. The loading port 402 may be sealed during processing of the substrate 426. The processing chamber 400 may also include gas port 404 through which the plasma is introduced to the processing chamber 400. A pump screen 410 may be disposed within the processing chamber 400.

A movable stage 420 may be configured to retain thereon a substrate 426 that has been loaded into the processing chamber 400 via the loading port 402, The movable stage 420 may include a chuck 422 on which the substrate 426 is retained and a stem 424a, 424b that supports the chuck 422. The movable stage 420 may retain the substrate 426 via vacuum ports on the chuck 422. The movable stage 420 may be centered within the processing chamber 400 such that the edges of the chuck 422 are equidistant from the sidewalls of the processing chamber 400.

The stem 424a, 424b may extend downwardly straight from the chuck 422, bending at a substantially perpendicular angle (within 1-2° dependent on, e.g., mechanical tolerances) and extend through a side portion of the processing chamber 400. The stem may thus have a vertical portion 424a extending in a vertical direction from the chuck 422 and a horizontal portion 424b extending in a horizontal direction from the vertical portion 424a, the vertical direction being a direction from the top of the processing chamber 400 to the bottom of the processing chamber 400 and the horizontal direction being a direction between the opposing sidewalk of the processing chamber 400. One of the sidewalls of the processing chamber 400 may contain an opening 402 through which the horizontal portion 424b of the stem extends.

The gas port 404 may be disposed at a top of the processing chamber 400. Similar to the movable stage 420, the gas port 404 may be centered within the processing chamber 400 such that the gas port 404 is equidistant from the sidewalls of the processing chamber 400. The gas port 404 may be centered over the movable stage 420 such that the centerline of the gas port 404 and the centerline of the movable stage 420 are aligned.

The electromagnetic field is used to enable etching of the substrate 426 by the plasma formed by the gas introduced from the gas port 404. The electromagnetic field may be created by a source RF 442 and a bias RF 452. The bias RF 452 is supplied via a cathode assembly on the stem 424. The source RF 442 and bias RF 452 may operate at the voltage and frequency parameters described previously. The source RF 442 may be disposed and extend symmetrically along an outer edge of the top of the processing chamber 400 while the bias RF 452 is applied to the movable stage 420. Both the source RF 442 and bias RF 452 may be disposed to provide a homogeneous potential difference between the source RF 442 and bias RF 452, thereby creating a symmetrical bias for the plasma to react with the substrate 422 and produce reacted process gases.

A pump 430 for extracting gases from the processing chamber 400 may be attached at the bottom portion of the processing chamber 400. The pump screen 410 may prevent debris and other etching byproducts from falling into an inlet of the pump 430. The movable stage 420 may be repositioned between an upper position in which the substrate 426 is loaded onto or unloaded from the chuck 422, a middle position in which the substrate 426 is etched, and a lower position in which the higher pressure processing is performed in the processing chamber 400. The higher pressure is above the pressure for the pump 430 used (e.g., above about 0.1 mbar), and may be defined by the gap between moving blades and stationary blades (which is less than the mean free path of particles traveling through the pump 430). In some embodiments, the pump screen 410 may have an opening 412 sized to fit the chuck 422. The movable stage 420 may also rotate at the rotational speeds described above or may be limited to vertical movement only during etching.

The pump 430 may be a turbomolecular pump, a molecular drag pump, or a turbo/drag pump. Independent of the type of pump, the pump 430, may be centered at the bottom portion of the processing chamber 400 such that the centerline of the pump 430 is aligned with the centerline of the gas port 404 and the movable stage 420.

In some embodiments, when high pressure processes are conducted inside the chamber 400 the pump 430 may be cycled off, and subsequently reactivated after the high pressure processes are conducted inside the chamber 400. This process, however, may take a relatively long time, e.g., over about 4 minutes to raise the pressure in the chamber 400, and then 15-20 minutes to reduce the pressure in the chamber 400 to the pressure used in low pressure processes. In addition, such cycling may result in adverse effects to the pump 430.

In some embodiments, the pump 430 may have a valve at an inlet of the pump 430 adjacent to the chamber 400. The valve may be a plate that covers the inlet of the pump 430. The valve may be used to seal the pump 430 from the chamber 400, thereby isolating the pump 430 from the chamber 400 when high pressure processes are to be conducted inside the chamber 400 while the pump 430 remains active. However, such a valve may be made of metal and thus be relatively expensive. Thus, in some embodiments, such as that shown in FIG. 4, the valve may not be present in the pump 430. Instead, the chamber 400 may contain a travel stop 414 that controls the progress of the movable stage 420 downward, away from the gas port 404. The travel stop 414 may be an integral part of the chamber 400 or may be non-integral with the chamber 400 and formed from a non-volatile rigid material, such as a polymer. The travel stop 414 may have a hole disposed therein that is sized to allow the stem 424 and a lower portion of the chuck 422 to pass therethrough, while stopping an upper portion of the chuck 422 on which the substrate 426 is retained. The horizontal portion of the stem 424 may be disposed below the travel stop 414, between the travel stop 414 and the bottom of the processing chamber 400.

A chamber seal 416 may be disposed in a groove on the travel stop 414 to engage with the bottom surface of the upper portion of the chuck 422. In some embodiments, the portion of the chamber seal 416 facing the bottom surface of the upper portion of the chuck 422 may be flat. The chamber seal 416 may be formed from a flexible non-conductive, non-volatile material such as a halogen-resistant polymer, e.g. a fluoropolymer such as perfluoropentane (PFP) or FKM, although the material forming the chamber seal 416 may depend on the chamber use/applications operated in the chamber 400. Although FIG. 4 illustrates that the chamber seal 416 is disposed in a groove on the travel stop 414, in other embodiments, the chamber seal 416 may be disposed in a groove on the bottom surface of the upper portion of the chuck 422. In such embodiments, the portion of the chamber seal 416 facing the top surface of the travel stop 414 may be flat.

As discussed above, the vertical portion 424a may be movable, while the horizontal portion 424b may remain fixed. As shown in FIG. 4, the horizontal portion 424b may be a sealed duct that has a hole through which the vertical portion 424a passes. The vertical portion 424a may be movable within the horizontal portion 424b from a lowest position to at least an upper position. At the lowest position, the chuck 422 contacts the chamber seal 416 and seals the lower portion of the processing chamber 400 to which the pump 430 is isolated from the upper portion of the processing chamber 400 that contains the substrate 426. At the upper position, the substrate 426 is in position to be loaded into/unloaded from the chamber via the loading port 402. As shown, in some embodiments, up to several cm may remain between the vertical portion 424a and the bottom of the horizontal portion 424b when the vertical portion 424a is in the lowest position; similarly, up to several cm may remain between the vertical portion 424a and the top of the horizontal portion 424b when the vertical portion 424a is in the upper position.

In some embodiments, the movable stage 420 may be driven with a motor (not shown) or a bellows may be used. The movable stage 420 may be driven by the motor or bellows to raise or lower the movable stage 420 vertically, for example until the movable stage 420 contacts and compresses the chamber seal 416. At this point, a current limiter on the motor may stop the downward motion of the movable stage 420 at a lower position until the motor drive is reversed to raise the movable stage 420 to the processing position. When the movable stage 420 is in the lower position, the chamber seal 416 may permit the lower portion of the chamber 400 (essentially under the travel stop 414), and thus pump 430, to be isolated from the upper portion of the chamber 400 (essentially above the travel stop 414).

In some embodiments, a flange or gasket (not shown) may be used to seal the area around the hole in the horizontal portion 424b. Electrical connections associated with providing a cathode voltage to, as well as cooling lines to cool the movable stage 420 can be flexible. In some embodiments, the electrical connections and/or cooling lines may be disposed within the horizontal portion 424b, while in other embodiments, the electrical connections and/or cooling lines may be external to the interior of the horizontal portion 424b.

Figure 5:
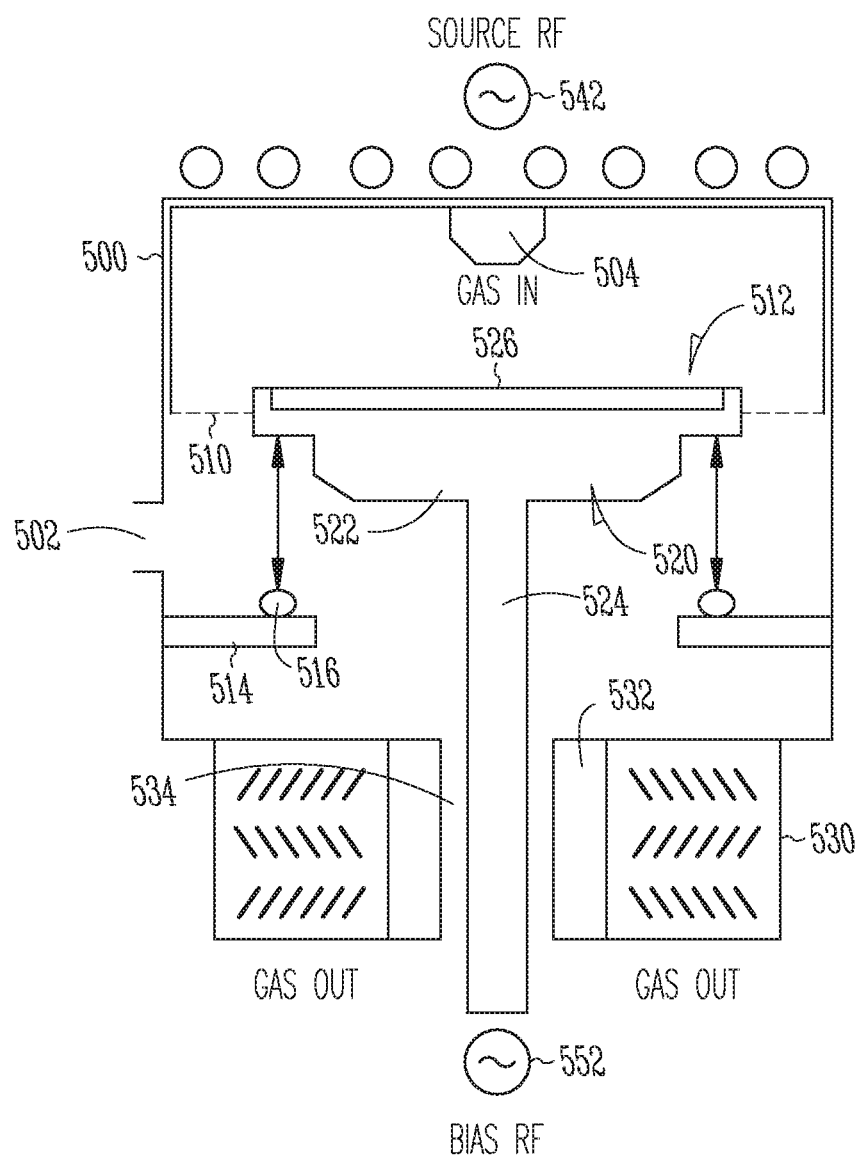
FIG. 5 shows a processing chamber, according to some example embodiments.

FIG. 5 shows a processing chamber, according to some example embodiments. Similar to the above, the processing chamber 500 may include loading port 502 through which a substrate 526 is loaded into and unloaded from the processing chamber 500. The loading port 502 may be sealed during processing of the substrate 526. The processing chamber 500 may also include gas port 504 through which the plasma is introduced to the processing chamber 500. A pump screen 510 may be disposed within the processing chamber 500.

A movable stage 520 may be configured to retain thereon a substrate 526 that has been loaded into the processing chamber 500 via the loading port 502. The movable stage 520 may include a chuck 522 on which the substrate 526 is retained and a stem 524 that supports the chuck 522. The movable stage 520 may retain the substrate 526 via vacuum ports on the chuck 522. The movable stage 520 may be centered within the processing chamber 500 such that the edges of the chuck 522 are equidistant from the sidewalls of the processing chamber 500. Similarly, the stem 524 may extend downwardly straight from the chuck 522 through a bottom portion of the processing chamber 500 along a central vertical axis thereof so that the stein 524 is also centered within the processing chamber 500.

The gas port 504 may be disposed at a top of the processing chamber 500. Similar to the movable stage 520, the gas port 504 may be centered within the processing chamber 500 such that the gas port 504 is equidistant from the sidewalls of the processing chamber 500. The gas port 504 may be centered over the movable stage 520 such that the centerline of the gas port 504 and the centerline of the movable stage 520 are aligned.

The electromagnetic field is used to enable etching of the substrate 526 by the plasma formed by the gas introduced from the gas port 504. The electromagnetic field may be created by a source RF 542 and a bias RF 552. The bias RF 552 is supplied via a cathode assembly on the stem 524. The source RF 542 and bias RF 552 may operate at the voltage and frequency parameters described previously. The source RF 542 may be disposed and extend symmetrically along an outer edge of the top of the processing chamber 500 while the bias RF 552 is applied to the movable stage 520. Both the source RF 542 and bias RF 552 may be disposed to provide a homogeneous potential difference between the source RF 542 and bias RF 552, thereby creating a symmetrical bias for the plasma to react with the substrate 522 and produce reacted process gases.

A pump 530 for extracting gases from the processing chamber 500 may be attached at the bottom portion of the processing chamber 500. The pump screen 510 may prevent debris and other etching byproducts from falling into an inlet of the pump 530. The movable stage 520 may be repositioned between an upper position in which the substrate 526 is etched and a lower position in which the substrate 526 is loaded onto or unloaded from the chuck 522. In some embodiments, the pump screen 510 may have an opening 512 sized to fit the chuck 522. The movable stage 520 may also rotate at the rotational speeds described above or may be limited to vertical movement only during etching.

The pump 530 may be a turbomolecular pump, a molecular drag pump, or a turbo/drag pump. Independent of the type of pump, the pump 530, may be centered at the bottom portion of the processing chamber 500 such that the centerline of the pump 530 is aligned with the centerline of the gas port 504 and the movable stage 520. The pump 530 may contain a rotor core 532 with a through passage 534 at the center. The through passage 534 may extend entirely through the pump 530, from the inlet side of the pump 530 adjacent to the processing chamber 500 to the exhaust side of the pump 530. The diameter of the through passage 534 may be slightly larger than the diameter of the stem 524 to permit the through passage 534 to accept the stem 524, allowing the stem 524 to extend vertically below the pump 530.

The pump 530 may not have the valve described above. Instead, the chamber 500 may contain a travel stop 514 that retards the progress of the movable stage 520 downward, away from the gas port 504. The travel stop 514 may be an integral part of the chamber 500 or may be non-integral with the chamber 500 and formed from a non-volatile rigid material, such as a polymer. The travel stop 514 may have a hole disposed therein that is sized to allow the lower portion of the chuck 522 to pass therethrough, while stopping the upper portion of the chuck 522 on which the substrate 526 is retained.

A chamber seal 516 may be disposed in a groove on the travel stop 514 to engage with the bottom surface of the upper portion of the chuck 522. In some embodiments, the portion of the chamber seal 516 facing the bottom surface of the upper portion of the chuck 522 may be flat. The chamber seal 516 may be formed from a flexible non-conductive, non-volatile material such as a halogen-resistant polymer, e.g. a fluoropolymer such as perfluoropentane (PFP) or FKM, although the material foaming the chamber seal 516 may depend on the chamber use/applications operated in the chamber 500. Although FIG. 5 illustrates that the chamber seal 516 is disposed in a groove on the travel stop 514, in other embodiments, the chamber seal 516 may be disposed in a groove on the bottom surface of the upper portion of the chuck 522. In such embodiments, the portion of the chamber seal 516 facing the top surface of the travel stop 514 may be flat.

In some embodiments, the movable stage 520 may be driven with a motor (not shown), The movable stage 520 may be driven downward until the movable stage 520 contacts and compresses the chamber seal 516. At this point, a current limiter on the motor may stop the downward motion of the movable stage 520 at a lower position until the motor drive is reversed to raise the movable stage 520 to the processing position. When the movable stage 520 is in the lower position, the chamber seal 516 may permit the lower portion of the chamber 500 (essentially under the travel stop 514), and thus pump 530, to be isolated from the upper portion of the chamber 500 (essentially above the travel stop 514).

Figure 6:
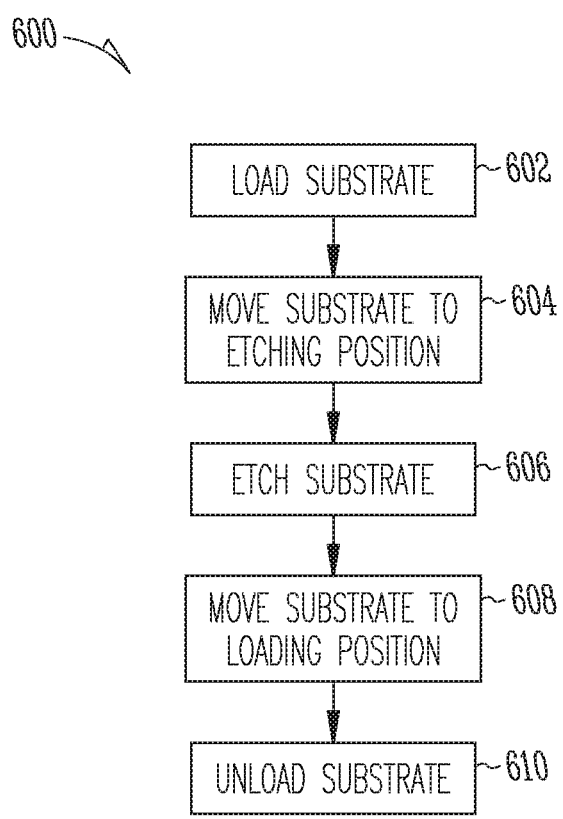
FIG. 6 is a flow chart showing operations in a method, according to an example embodiment.

FIG. 6 is a flow chart showing operations in a method, according to an example embodiment. Although various operations are shown in FIG. 6, the embodiment shown is only an example; other operations may be present and/or some of the operations shown may not be present. A method 600 of etching a substrate is shown in which at operation 602 the substrate is loaded into a processing chamber. The substrate may be loaded onto a chuck of a stage that also has a stem. The substrate may be retained on the chuck using a vacuum that is provided via holes in the chuck.

The chuck may be in a loading position when the substrate is loaded thereon. The chuck may extend through an opening in a pump screen during the loading. The opening may be sized to admit the chuck therethrough. After loading, the stage containing the substrate may be moved to an etching position at operation 604. If the opening is adjustable, the opening may be adjusted when the stage is in the etching position to adjust pressure in the chamber. In particular, one or more pressure sensors may be provided at one or more locations in the processing chamber. The pressure sensors may determine whether the pressure varies in the chamber by more than a predetermined threshold over time and/or over distance. A controller may be used to detect the pressure and control the opening to maintain a stable pressure.

The stage may be moved by using a motor to move a stem of the stage through a core of a pump disposed at a bottom of the processing chamber. In some embodiments, the stage may be moved by rotating the stage to engage one or more spiral grooves formed either in the stem opposing an inner surface of the core or in the inner surface of the core. In the former case, the inner surface of the core may be planar, while in the latter case the surface of the stem opposing the inner surface of the core may be planar. The spiral groove may have dimensions to provide pumping action to counter back streaming of the gas from an exhaust of the pump to the processing chamber in an intermediate and viscous flow regime inside a gap between the stem and the core. Movement of the stage may be retarded using a travel stop disposed in the processing chamber. In particular, the travel stop may have a hole disposed therein sized to allow a lower portion of the chuck to pass therethrough while stopping an upper portion of the chuck.

After moving the stage to an etching position, at operation 606 the substrate may be etched using gas introduced into an upper region of the processing chamber. After completing etching, the stage may be moved from the etching position to the loading position at operation 608 by moving the stem of the stage through the core of the pump. The etched substrate may then be unloaded at operation 610.

The processing chamber may be used for processes other than etching, and may be cleaned after etching the substrate and prior to loading another substrate into the processing chamber for etching or other processing. In some cases, if the processing chamber is used for higher-pressure processing, the processing chamber may be isolated from the pump. The pump may have a shield configured to seal off the pump or the upper region of the processing chamber above the travel stop may be isolated from the lower region of the processing chamber below the travel stop using a chamber seal disposed in a groove on the travel stop or a lower portion of the chuck. This may allow the pressures in the upper and lower regions of the processing chamber to be independent.

Although only semiconductor substrates are described above, with Si substrates being mentioned specifically, other substrates may be used with the above processing chamber. Such substrates may include elemental semiconductors other than Si (such as Ge), compound semiconductors including binary compounds (e.g., GaAs, InP), tertiary compounds (e.g., AlGaAs, InGaP), quaternary (e.g., InGaAsP) or other group III-V or II-VI compounds (e.g., GaN). Further substrates may include non-metallic and non-semiconductor materials such as flat panel displays or films such on polyethylene-terephthalate (PET) or other types of, e.g., semi-crystalline polymers, used for use in ultra-light semiconductor device fabrication.

A computer may be used to operate the system shown in FIGS. 1-5 to, among others, load/unload the semiconductor substrate, activate the pump and/or motor, adjust the screen openings and/or position of the movable stage, and etch the semiconductor substrate by controlling the operational parameters such as gas flow rate, applied bias, spin speed of the chuck, etc. The computer may include a hardware processor (e.g., a central processing unit (CPU), a GPU, a hardware processor core, or any combination thereof), a main memory and a static memory, some or all of which may communicate with each other via an interlink (e.g., bus). The main memory may contain any or all of removable storage and non-removable storage, volatile memory or non-volatile memory. The computer may further include a display unit such as a video display, an alphanumeric input device (e.g., a keyboard), and a user interface (UI) navigation device (e.g., a mouse) in an example, the display unit, input device and navigation device may be a touch screen display. The computer may additionally include a storage device (e.g., drive unit), a signal generation device (e.g., a speaker), a network interface device, and one or more sensors, such as a global positioning system (GPS) sensor, compass, accelerometer, or other sensor. The computer may further include an output controller, such as a serial (e.g., universal serial bus (USB), parallel, or other wired or wireless (e.g., infrared (IR), near field communication (NFC), etc. connection to communicate or control one or more peripheral devices (e.g., a printer, card reader, etc.

The storage device may include a non-transitory machine readable medium (hereinafter simply referred to as machine readable medium) on which is stored one or more sets of data structures or instructions (e.g., software) embodying or utilized by any one or more of the techniques or functions described herein. The instructions may also reside, completely or at least partially, within the main memory, within static memory, and/or within the hardware processor during execution thereof by the computer. While the machine readable medium is illustrated as a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the computer and that cause the computer to perform any one or more of the techniques of the present disclosure, or that is capable of storing, encoding or carrying data structures used by or associated with such instructions. Non-limiting machine readable medium examples may include solid-state memories, and optical and magnetic media. Specific examples of machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; Random Access Memory (RAM); and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks. Communications over the networks may include one or more different protocols, such as Institute of Electrical and Electronics Engineers (IEEE) 802.11 family of standards known as Wi-Fi, IEEE 802.16 family of standards known as WiMax, IEEE 802.15.4 family of standards, a Long Term Evolution (LTE) family of standards, a Universal Mobile Telecommunications System (UMTS) family of standards, peer-to-peer (P2P) networks, a next generation (NG)/5th generation (5G) standards among others. In an example, the network interface device may include one or more physical jacks (e.g., Ethernet, coaxial, or phone jacks) or one or more antennas to connect to the transmission medium.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

What is claimed is:

1. A processing chamber system comprising:
   a processing chamber comprising:
     a gas port to introduce gas into an upper region of the processing chamber;
     a stage disposed within the processing chamber under the gas port; and
     a pump arranged at a lower region of the processing chamber to remove the gas from the processing chamber, the pump including a core having a central passage disposed therein,
   wherein the stage comprises a chuck configured to retain a substrate and a stem extending from the chuck, the stem configured to pass through the central passage in the core, wherein a ring-shaped gap is formed between the stem and an inner surface of the core;
   wherein the lower region of the processing chamber has an opening configured to align with the passage and accept the stem,
   wherein one or more spiral grooves are formed in the stem or in the inner surface of the core,
   wherein the stem and the core are rotatable in opposite directions to provide pumping action to counter back streaming of the gas from an exhaust of the pump to the processing chamber inside the gap between the stem and the core, and
   a controller operable to cause rotation of the stem and the core in opposite directions.

2. The processing chamber system of claim 1, wherein:
   the one or more spiral grooves are formed only in the inner surface of the core.

3. The processing chamber system of claim 1, wherein:
   the stage is disposed symmetrically within the processing chamber with respect to the gas port, the core of the pump and the stem are aligned along a centerline under the gas port.

4. The processing chamber system of claim 1, wherein:
   a sidewall of the processing chamber has an opening through which the substrate is configured to pass during loading of the substrate on the chuck prior to etching and unloading of the substrate from the chuck after etching.

5. The processing chamber system of claim 4, wherein:
   the stage is movable between a lower position at which the substrate is able to be loaded onto and unloaded from the stage and an upper position at which the substrate is positioned to be processed.

6. The processing chamber system of claim 5, further comprising:
   a pump screen disposed in the processing chamber, the pump screen having an opening through which the stage is disposed when in the upper position.

7. The processing chamber system of claim 6, wherein:
   the opening in the pump screen is adjustable.

8. The processing chamber system of claim 7, wherein:
   the pump screen is formed by overlapping slats, the opening adjusted by adjustment of overlap between at least one pair of slats.

9. The processing chamber system of claim 1, wherein:
   a seal is disposed around the core of the pump and the stem of the stage, the seal configured to seal the passage in the core.

10. The processing chamber system of claim 1, further comprising:
    a travel stop configured to limit movement of the stage toward the pump.

11. The processing chamber system of claim 10, wherein:
    the travel stop has a hole disposed therein sized to allow a lower portion of the chuck to pass therethrough while stopping an upper portion of the chuck.

12. The processing chamber system of claim 10, further comprising:
    a chamber seal disposed in a groove on one of the travel stop or a lower portion of the chuck, the chamber seal configured to isolate the upper region of the processing chamber, which is above the travel stop, from the lower region of the processing chamber, which is below the travel stop, such that pressures in the upper and lower regions of the processing chamber are isolated from each other.

13. The processing chamber system of claim 1, wherein:
the one or more spiral grooves are formed only in the stem.

* * * * *